US012571861B2

(12) United States Patent
Wang et al.

(10) Patent No.: US 12,571,861 B2
(45) Date of Patent: Mar. 10, 2026

(54) RESONANT PRECESSION MODULATION BASED MAGNETIC FIELD SENSORS

(71) Applicant: THE REGENTS OF THE UNIVERSITY OF CALIFORNIA, Oakland, CA (US)

(72) Inventors: Yuanxun Ethan Wang, Manhattan Beach, CA (US); Lap Kun Yeung, Los Angeles, CA (US); Kevin Luong, Los Angeles, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 178 days.

(21) Appl. No.: 18/487,100

(22) Filed: Oct. 15, 2023

(65) Prior Publication Data

US 2024/0125874 A1     Apr. 18, 2024

Related U.S. Application Data

(62) Division of application No. 17/325,801, filed on May 20, 2021, now Pat. No. 11,821,965.

(60) Provisional application No. 63/027,816, filed on May 20, 2020.

(51) Int. Cl.
*G01V 3/00* (2006.01)
*G01R 33/24* (2006.01)
(52) U.S. Cl.
CPC ................................... *G01R 33/24* (2013.01)

(58) Field of Classification Search
USPC .......................................................... 324/301
See application file for complete search history.

(56) References Cited

U.S. PATENT DOCUMENTS

| | | | |
|---|---|---|---|
| 8,593,141 B1 * | 11/2013 | Radparvar ........... | G01R 33/567 324/309 |
| 11,821,965 B2 | 11/2023 | Wang | |
| 2007/0090836 A1 * | 4/2007 | Xiang .................... | G01R 33/60 324/306 |

OTHER PUBLICATIONS

Leong, Kevin Quy Tanh et al., "Resonant Precession Modulation Based Magnetic Field Receivers", arXiv:2001.08059 [physics.app-ph], downloaded from https://arxiv.org/abs/2001.08059, online Jan. 22, 2020.

* cited by examiner

*Primary Examiner* — Walter L Lindsay, Jr.
*Assistant Examiner* — Frederick Wenderoth
(74) *Attorney, Agent, or Firm* — O'BANION & RITCHEY LLP; John P. O'Banion

(57) ABSTRACT

A magnetic field sensor which can achieve sensitivities competitive with modern sensors while simultaneously maintaining a small size, low power consumption, simplicity of design, and low cost. The magnetic field sensor utilizes nonlinear precession dynamics of subatomic spins to attain parametric amplification of a magnetic field. A preliminary experimental implementation of the proposed concept establishes its feasibility and can already demonstrate significant benefits over existing approaches to sensing.

7 Claims, 7 Drawing Sheets

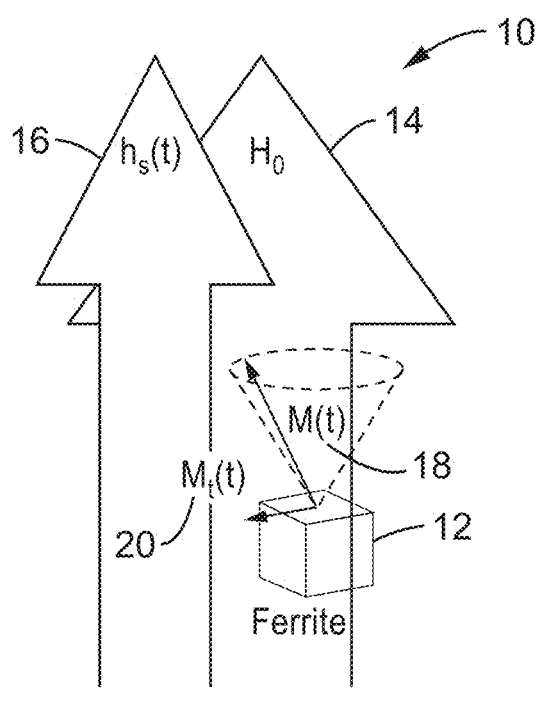
FIG. 1A
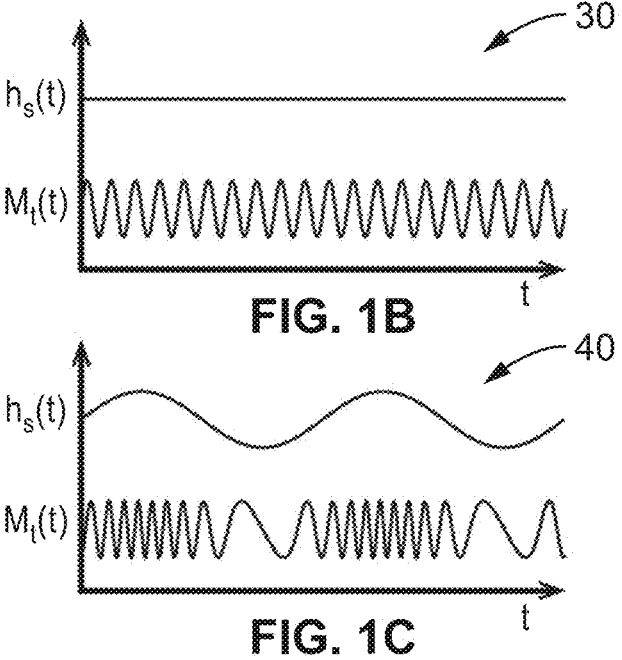
FIG. 1B
FIG. 1C

RESONANT PRECESSION MODULATION BASED MAGNETIC FIELD SENSORS

This application is a division of U.S. patent application Ser. No. 17/325,801 filed on May 20, 2021, incorporated herein by reference in its entirety, which claims priority to, and the benefit of, U.S. provisional patent application Ser. No. 63/027,816 filed on May 20, 2020, incorporated herein by reference in its entirety. Priority is claimed to each of the foregoing applications.

STATEMENT REGARDING FEDERALLY SPONSORED RESEARCH OR DEVELOPMENT

Not Applicable

NOTICE OF MATERIAL SUBJECT TO COPYRIGHT PROTECTION

BACKGROUND

1. Technical Field

The technology of this disclosure pertains generally to magnetic field sensors, and more particularly to employing nonlinear precession dynamics of subatomic spins to attain parametric amplification of a magnetic field.

2. Background Discussion

Magnetic field sensors have been one of the cornerstone technologies in advancing the progress of research and development in many areas. From geophysics to biomedicine to communications, the collective domain over which magnetic field sensing and detection spans is incredibly broad and the specific applications for its use are extremely diverse.

However, these current magnetic sensor technologies represent significant tradeoffs between sensitivity and practicality.

Accordingly, the present disclosure provides a magnetic sensor technology which can provide high levels of sensitivity while remaining practical in terms of size, fabrication and cost factors.

BRIEF SUMMARY

This disclosure describes a sensor for detecting weak very low frequency (VLF) magnetic fields, as well a very low frequency (VLF) antenna, based on spin precession modulation (SPM). The sensor and antenna exhibit high sensitivity and are practical for use in many applications in which detection of low level signals is required.

Further aspects of the technology described herein will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING

The technology described herein will be more fully understood by reference to the following drawings which are for illustrative purposes only:

FIG. 1A through FIG. 1D are diagrams which illustrate ferrite magnetization precession in the presence of a magnetic bias field with both static and time varying components, as utilized according to at least one embodiment of the present disclosure.

DETAILED DESCRIPTION

1. Introduction

Figure 1D:
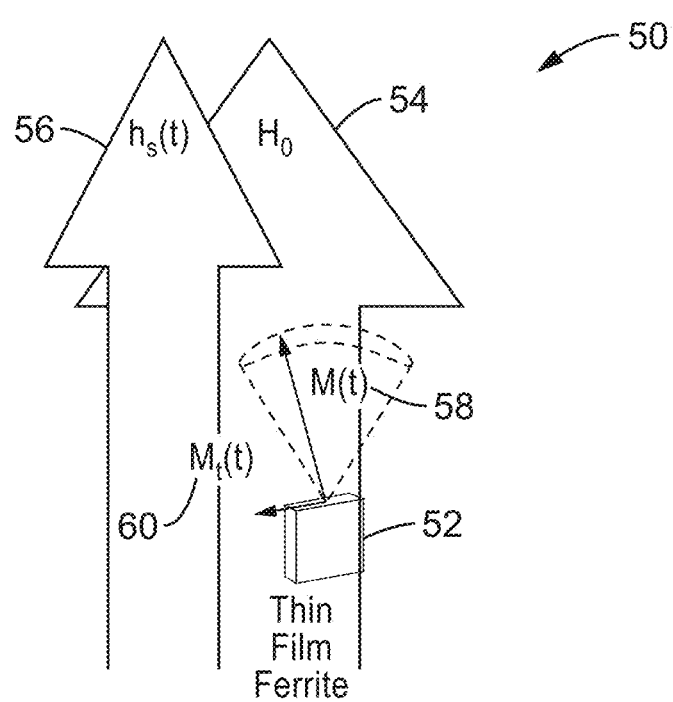

High sensitivity magnetic field sensing is becoming increasingly important in today's technological landscape from geophysics to biomedicine to communications. In view of this a broad range of magnetic sensor types have been proposed or developed.

There consequently has arisen an almost equally diverse range of approaches to magnetic field sensor design in terms of foundational principles of operation. For example, super quantum interference device (SQUID) sensors operate based on the quantization of magnetic flux, optically pumped sensors operate based on atomic magneto-optic effects, induction sensors operate based on Faraday's law of induction, and magnetic tunnel junction sensors operate based on polarization dependent electron tunneling.

One defining characteristic of a magnetic field sensor is sensitivity—the lowest field value that can be detected above the noise floor in a unit of output bandwidth. A higher sensitivity, or the ability to detect weaker fields, is crucial in modern applications where working with weak fields is the overwhelming norm. The sensitivity is strongly dependent on the principle of operation of a sensor; however, the fact that there are still so many sensor types used today clearly indicates that there are other important characteristics that must also be considered. Specifically, it tends to be the case that principles yielding higher sensitivity have tradeoffs with regards to sensor size or power consumption that limit practicality and cost of implementation.

The tradeoff between sensitivity and practicality may be better illustrated by examining various principles of operation. SQUID magnetic field sensors are widely recognized to be the most sensitive devices, able to achieve sensitivities better than 1 $fT/Hz^{1/2}$; however, they require cryogenic cooling which leads to a system that is large and costly in terms of construction and power consumption. Optically pumped sensors can be competitive with SQUIDs in sensitivity, but are afflicted by the requirement of optically pumped, heated atomic vapor cells which contribute again to a large and costly system that is complex to design and manufacture.

Optically pumped sensors are capable of achieving sub-$pT/Hz^{1/2}$ sensitivities in the kHz to MHz frequency range but require a sensor volume of approximately 57 cubic millimeters and power consumption on the order of Watts. Inductive sensors boast zero power consumption while also being able to attain sensitivities better than 1 $fT/Hz^{1/2}$; however, reaching these sensitivities generally requires the device to be prohibitively large or heavy. The use of inductive sensors can achieve sub-$fT/Hz^{1/2}$ sensitivity in the hundreds of Hz to hundreds of kHz frequency range but require a sensor area of more than 24 square meters.

Magnetic tunnel junctions can be made extremely small; however, they consume moderate amounts of power and achieve moderate sensitivities. The use of an MgO based magnetic tunnel junction sensor was constructed with a sensor area of just 626 $\mu m^2$, but there is only 97 $pT/Hz^{1/2}$ sensitivity below 500 kHz as well as a power consumption of around −7 dBm (~0.1995 mW).

In contrast, the present disclosure introduces a novel approach that allows for the realization of sensitive magnetic field sensors operating in the low frequency (LF) and very low frequency (VLF) bands that also maintain a high degree of practicality. A preliminary design exhibits a sensitivity threshold of less than 27 $pT/Hz^{1/2}$ flat in these bands. While this design has only a moderately high sensitivity, it boasts a sensor volume of only 0.053 cubic millimeters ($mm^3$) and a very low power consumption of just −40 dBm (~$1e^{-7}$ Watts).

The approach to magnetic field sensing described herein was inspired by optical magnetometry which exploits the nonlinearities of electron spin precession dynamics to achieve parametric amplification and will hereafter be referred to as resonant precession modulation (RPM).

Operation in the VLF and LF bands encompass applications that include underground and underwater communications, space plasma research, or low-cost magnetic resonance imaging.

The following sections will first cover the basic principles of RPM and derive analytical expressions describing RPM based sensors. The advantages of these sensors are then discussed along with an approach for practical implementation. Finally, the setup and results are presented for both simulations and a preliminary experiment.

2. Principles of Operation

FIG. 1A through FIG. 1D illustrate aspects 10, 30, 40 and 50 of magnetization dynamics of a ferrite material.

In FIG. 1A is illustrated 10 a ferrite material 12 exhibiting ferrite magnetization M(t) precession 18, with ferrite magnetization $M_r(t)$ 20, seen in the presence of a magnetic bias field with both a static $H_0$ 14 and time varying $h_s(t)$ 16 component.

In FIG. 1B is shown a time domain plot 30 qualitatively depicting $h_s(t)$ as well as a component of the ferrite magnetization $M_r(t)$ transverse to the bias field for the case where $h_s(t)$ is constant.

In FIG. 1C is shown 40 a similar plot depicting both $h_s(t)$ and $M_r(t)$ for the case where $h_s(t)$ is varying sinusoidally.

In FIG. 1D is illustrated 50 a thin film ferrite material 52 exhibiting ferrite magnetization precession M(t) 58, with $M_r(t)$ 60, in the presence of a magnetic bias field with both a static $H_0$ 54 and time varying $h_s(t)$ 56 component. Demagnetization effects cause the precession to resemble a pendulum oscillation.

Although inspired by optical magnetometry, an extension of spin dynamics-based magnetic field sensors requires significant changes to rectify those aspects which contribute to the unsuitability of optical magnetometers for use in many magnetic field sensing applications. Perhaps foremost among these changes involves the medium from which the spins are sourced. Optical magnetometers use spins sourced from atomic vapors, the glass containers of which are the bottleneck preventing reductions in cost and device size. In contrast, the present disclosure focuses instead on spins sourced from insulating ferrimagnetic materials, or ferrites. The insulating nature, low magnetic loss at high frequencies, and significant saturation magnetization values of ferrites are all imperative toward achieving high performance magnetic field sensors. Some of these attributes motivated inductive coil antennas using ferrites, although of course these never employed the use of nonlinear spin precession dynamics or other aspects of the operating principles of the present disclosure. Ferrites additionally have an extensive history of incorporation in general high frequency electronics resulting in now well-established processing methods that allow the material to be produced relatively inexpensively, which can be leveraged when implementing the teachings of the present disclosure.

Using ferrites as the selected medium, analysis of spin dynamics may be accomplished through application of micromagnetic theory. This theory is able to practically describe the average behavior of the large ensemble of spins of a macroscopic ferrite material and is formulated classically in terms of the spatially and temporally dependent material magnetization M(r,t) based on a continuum approximation. References to magnetization as opposed to spin will consequently be made for all following analyses for the purposes of consistency, where it is recognized that either may be immediately determined based on knowledge of the other. From micromagnetic theory, the magnetization dynamics of a ferrite material are governed by the Landau-Lifshitz-Gilbert (LLG) equation:

$$\frac{dM(r,t)}{dt} = -\gamma\mu_0(M(r,t) \times H_e(r,t)) + \frac{\alpha}{M_S}\left(M(r,t) \times \frac{dM(r,t)}{dt}\right) \quad (1)$$

where $\gamma$ is the gyromagnetic ratio, $\mu_0$ is the permeability of free space, $H_e(r,t)$ is an effective magnetic field representing actual magnetic fields as well as various other physics, $\alpha$ is the Gilbert damping coefficient representing magnetic loss, and $M=|M(r,t)|$ is the saturation magnetization. For purposes of simplicity, the assumption will be made initially that $H_e(r,t)$ is spatially uniform with the dominant contributor to its value being some constant magnetic field $H_0$. It will further be assumed that the magnitude $|H_e(r,t)|=H_e(r,t)$ is sufficiently large such that M(r,t) is also spatially uniform, and that magnetic loss is neglected.

From the LLG equation (1), the means by which nonlinear spin precession dynamics may be used to characterize magnetic fields of electromagnetic waves is elucidated. The equation indicates the equilibrium state of M(t) to be aligned with $H_e$, where it is noted that spatial and temporal dependencies of these and all following variables will be omitted as appropriate. Any perturbation from the equilibrium state will result in a continuous precession of M(t) about $H_e$, as visualized in FIG. 1A and FIG. 1B, at the resonance frequency $f_0$ given by:

$$f_0 = \frac{1}{2\pi}\gamma\mu_0 H_e. \tag{2}$$

If magnetic loss is accounted for, the precession will dampen and M(t) will eventually spiral back to its equilibrium state. Equation (2) contains the essence of optical magnetometry operations in which it may be seen that, by determining $f_0$ through some means, an unknown $H_e$ can be directly computed. While such an approach is not readily extended suitably for receiving antenna operation, equation (2) also allows the correct presumption to be made that a time varying effective field magnitude, say due to an additional magnetic field $h_s(t)$ contributing to the effective field such that $H_e(t)=H_0+h_s(t)$, will result in a time varying precession frequency.

This nonlinear behavior, termed a resonant precession modulation (RPM), is visualized in FIG. 1C and is the key to achieving the desired magnetic field characterization. Framed in more practical terms, consider the precession of M(t) for a ferrite biased with a sufficiently large magnetic field $H_0$. A dynamic, spatially uniform magnetic field $h_s(t)$ is imposed on the ferrite and is polarized such that $h_s(t)$ is parallel to $H_0$, and will result in a time varying $H_e(t)$. This magnetic field thus manifests as a frequency modulation of the precession, a detection of which then allows for ensuing extraction of all the information that can be known about both the magnitude and phase of the dynamic field.

3. Embodiments

Figure 2A:
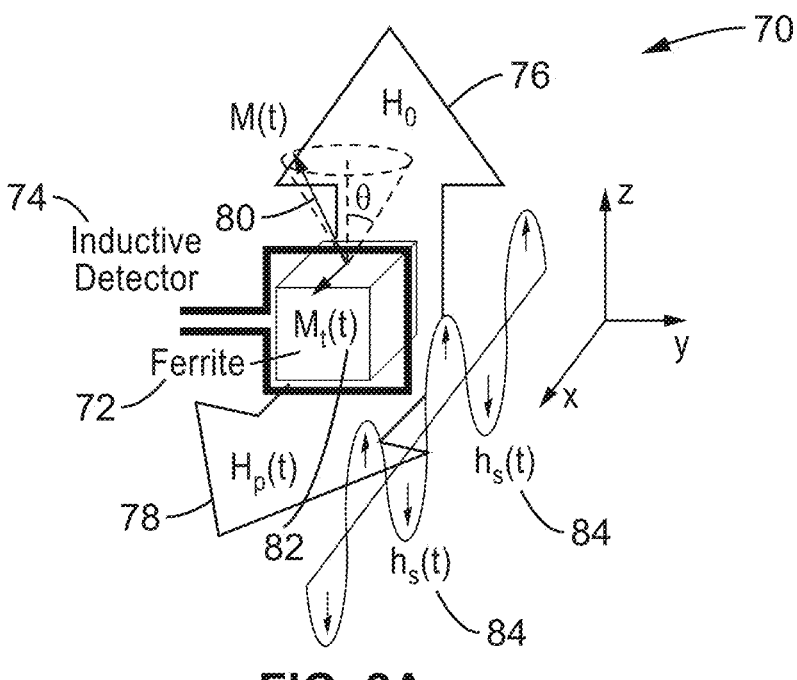
FIG. 2A through FIG. 2C are schematics of magnetic field sensor operation using resonant precession modulation (RPM) principles according to at least one embodiment of the present disclosure.
Figure 2B:
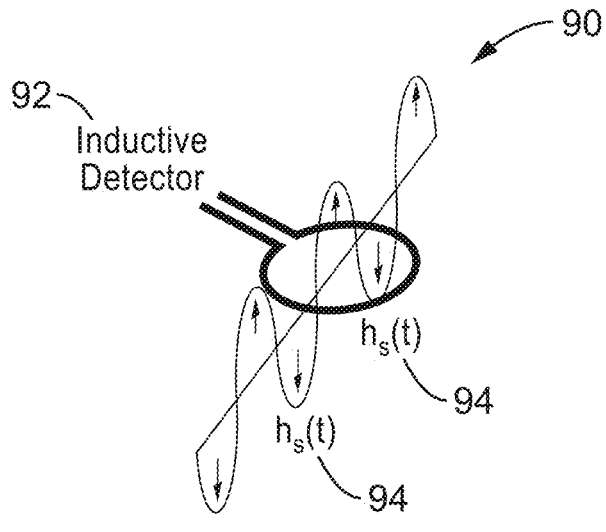
Figure 2C:
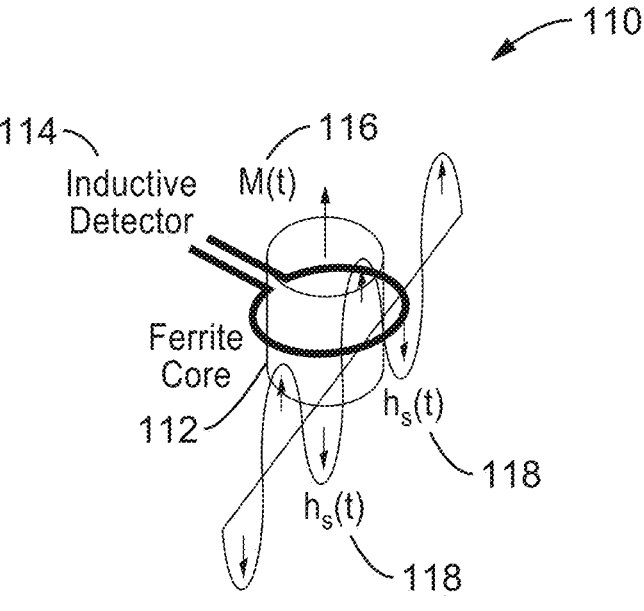

FIG. 2A through FIG. 2C illustrate example embodiments 70, 90 and 110 of magnetic field sensor operation.

In FIG. 2A is illustrated an inductive detector 74 surrounding ferrite material 72 shown performing magnetic field sensing under the principles of RPM depicting ferrite magnetization M(t) 80 precession, with $M_t(t)$ 82 where orientations of the bias magnetic field $H_0$ 76, the perturbing magnetic field $H_p(t)$ 78, the incident magnetic field $H_s(t)$ 84.

In FIG. 2B is illustrated 90 an inductive coil antenna 92 operation under conventional principles showing $H_s(t)$ 94.

In FIG. 2C is illustrated a ferrite rod (core) 112 loaded inductive coil 114 operation where positioning of the ferrite core within the inductive detector is visualized, with ferrite magnetization M(t) and magnetic field $H_s(t)$ 118 is shown.

3.1. Development of Analytical Expressions

A theoretical analysis of RPM details explicitly the manner in which magnetic field information is infused in spin dynamics, which provides the foundation for which advantages of magnetic field sensor operation based on RPM may be illuminated, and generates expressions that are verifiable through simulation.

Considering the scenario visualized in FIG. 2A in which a ferrite material is biased with a static magnetic field $H_0\hat{z}$ and a dynamic magnetic field $H_s(t)\hat{z}$ is incident at the material. As previously, the assumptions are made that both $H_0$ and the wavelength of the incident wave are sufficiently large. Unlike these previous descriptions, however, magnetic loss will not be neglected and so a perturbing magnetic field $H_p(t)\hat{x}$ at the frequency $f_0$ defined in equation (2) exists to maintain magnetization precession with a constant angle $\theta$ from its equilibrium state amid the effects of damping. This perturbing field is assumed to be sufficiently small such as to not contribute significantly to $H_e(t)$. Then $M_t(t)$ is a component of M(t) transverse to the bias field, and may be written from equation (1) as:

$$M_t(t) = M_s\sin(\theta)\cos\left(2\pi f_0 t + \int_{t-\tau}^{t}\gamma\mu_0 h_s(t)dt\right) \tag{3}$$

where $\tau=(2\pi f_0 a\alpha)^{-1}$ which is the characteristic decay time of resonant precession. Describing the magnetic field of the incident wave as $H_s(t)=H_s\cos(2\pi f_s t+\phi)$, equation (3) can be evaluated to yield:

$$M_t(t) = M_s\sin(\theta)\Big[\cos(2\pi f_0 t) - $$
$$\frac{1}{2}\gamma\mu_0 H_s\tau\sin(2\pi(f_0+f_s)t+\phi) - \frac{1}{2}\gamma\mu_0 H_s\tau\sin(2\pi(f_0-f_s)t-\phi)\Big] \tag{4}$$

under the conditions of $\gamma\mu_0 H_s\tau\ll 1$ and $2\pi f_s T\ll 1$. It may be seen from this equation that the effect of the wave is to generate terms in the precession dynamics at the sum and difference frequencies $f_0\pm f_s$, and that a detection of $M_t(t)$ theoretically allows all the information about the dynamic magnetic field to be extracted from these terms.

Equation (4) can be applied to analyze the amplification of the magnetic field information achieved by RPM as compared to those operating under conventional principles. In order to realize the necessary transduction to an electrical signal, an inductive detection of $M_t(t)$ is assumed using a simple conductive coil of N turns and area A oriented as shown in FIG. 2A. The amplitude $V_{RPM}$ of the open circuit voltage induced across the terminals of the coil, are effectively representative of the strength of the transduced signal, by a term of $M_t(t)$ at $f_0\pm f_s$ can be found using the principles of Faraday induction to be:

$$\frac{V_{RPM}}{V_{con}} = \frac{M_s\sin(\theta)}{\Delta H}\left(\frac{f_0}{f_s}\right) \text{where } \Delta H = \frac{2}{\mu_0\gamma\tau} \tag{7}$$

The same coil operating under conventional antenna principles as visualized in FIG. 2B, where the open circuit voltage amplitude $V_{con}$ across its terminals, is now induced directly by the incident magnetic field and so in order to achieve the largest possible voltage amplitude, the coil is oriented with its axis parallel to the magnetic field. Again, applying the principles of Faraday induction, this amplitude is given by:

$$V_{con}=2\pi NA\mu_0 H_s f_s. \tag{6}$$

Taking the ratio of equation (5) to equation (6), the signal amplification achieved by a receiving antenna based on RPM. as opposed to one operating under conventional principles, is found to be:

$$\frac{V_{RPM}}{V_{con}} = \frac{M_s \sin(\theta)}{\Delta H}\left(\frac{f_0}{f_s}\right) \tag{7}$$

$$\text{where } \Delta H = \frac{2}{\mu_0 \gamma \tau}$$

is the linewidth of resonant precession.

Equation (4) can be further applied to derive a metric independent of precession angle $\theta$ that will later be used to evaluate the validity of the developed theory through a comparison with simulation results. Specifically, this metric is the amplitude ratio of the $M_t(t)$ term at either the sum or difference frequency $f_0 \pm f_s$ to that at the unmodulated precession frequency $f_0$, expressed analytically as:

$$\left|\frac{M_t^{f_0 \pm f_s}}{M_t^{f_0}}\right| = \frac{H_s}{H_0}Q \tag{8}$$

$$\text{where } Q = \pi f_0 \tau$$

is the quality factor of the resonant precession. Applying Faraday's law, this amplitude ratio can also be found from the open circuit RMS voltages as $$\frac{V_{RPM}}{V_0} = \left|\frac{M_t^{RPM}}{M_t^0}\right| = \frac{H_s}{H_0}Q \tag{9}$$

where $V_0$ corresponds to the magnetization term at the resonance frequency.

The sensitivity of RPM sensors can be quantified recognizing that noise is dominated by ferrite damping noise. This noise can be modeled with a thermal resistor R and does not depend on the pumping power injected to maintain precession. A full circuit model for an RPM sensor is provided in FIG. 7 in the Supplementary section. Sensitivity then corresponds to the RMS field of interest $H_s/\sqrt{2}$, where $H_s$ is such that $$V_{RPM} = \sqrt{4kTR} \tag{10}$$

Here, k is the Boltzmann constant and T is temperature. Applying equation (10) to equation (11), an explicit expression for sensitivity can be derived as, $$\frac{H_s}{H_0}QV_0 = \sqrt{4kTR} \tag{11}$$

By convention, sensitivity is typically expressed in terms of the magnetic flux densities and so it will be denoted as $\delta B_s$, given as $$\delta B_{s,RPM} = \frac{\mu_0 H_0}{\sqrt{2}} = \frac{\mu_0 H_0}{Q}\sqrt{\frac{2kTR}{V_0^2}} = \mu_0 \Delta H \sqrt{\frac{2kT}{P_p}} \tag{12}$$

$$\text{where } P_p = V^2/R$$

is the pumping power consumed by the ferrite. It should be noted that the two sideband frequencies of equation (5) can be coherently combined with demodulation circuitry, resulting in an additional factor of $1/\sqrt{2}$ in the sensitivity of equation (12).

Previously, the effective field $H_e$ was described as encompassing the effects of magnetic fields as well as various other physics on the magnetization. These other physics are represented with additive components to $H_e$ and many can be neglected for a biased ferrite.

One component that may be significant however, is the demagnetization field. The demagnetization field accounts for the dipole-dipole interaction between spins and is dependent on the ferrite shape, size, and biasing. Of particular interest in this work are ferrites with a thin-film geometry, which lend themselves well to miniaturization and can be produced with high quality through mature processing methods. For an RPM sensor employing a thin film ferrite biased in-plane, the demagnetization field is indeed significant, necessitating modifications to the above equations. Magnetization precession in this case approximately resembles a pendulum oscillation, as visualized in FIG. 1D, with a resonance frequency $$\omega_0 = \mu_0 \gamma \sqrt{H_0(H_0 + M_s)}. \tag{13}$$

With the addition of the same time-harmonic $h_s(t)$, $|h_s(t)| \ll H_0$ polarized along the bias field, a Taylor expansion can be used to express the time varying precession frequency as $$\omega(t) = \omega_0 + \frac{\mu_0 \gamma(2H_0 + M_s)}{2\sqrt{H_0(H_0 + M_s)}}h_s(t). \tag{14}$$

The precession time constant $\tau$ and the quality factor Q are also modified by the demagnetization field, with $\tau = 2Q/\omega_0$ and $$Q = \frac{\sqrt{H_0(H_0 + M_s)}}{\alpha(2H_0 + M_s)}. \tag{15}$$

Equation (15) can then be re-written as, $$\omega(t) = \omega_0 + \frac{\mu_0 \gamma}{2\alpha Q}h_s(t) \tag{16}$$

Starting with equation (17) below, instead of equation (3), the exact same procedure taken to derive equations (5) through (13) can be applied to derive the analogous equations corresponding to an RPM sensor with a thin film ferrite. The open circuit RMS voltage for detection of one of the sidebands is $$V_{RPM} = \frac{1}{2\alpha Q}\frac{1}{2\sqrt{2}}\mu_0^2 \gamma H_s \tau NA\omega_0 M_s \sin(\theta) \tag{17}$$

$$= \frac{1}{2\sqrt{2\alpha}}\mu_0^2 \gamma H_s NA M_s \sin(\theta)$$

The amplification, amplitude ratio, and single sideband sensitivity are found to be $$\frac{V_{RPM}}{V_{ind}} = \frac{M_s \sin(\theta)}{\Delta H}\left(\frac{\omega_0}{\omega_s}\right) \tag{18}$$

9
-continued $$\left|\frac{M_t^{RPM}}{M_t^0}\right| = \frac{(2H_0 + M_s)}{2H_0(H_0 + M_s)}H_s Q = \frac{H_s}{\Delta H} \qquad (19)$$

$$\delta B_{s,RPM} = \mu_0 \Delta H \sqrt{\frac{2kT}{P_p}} \qquad (20)$$

where the linewidth is still defined as $\Delta H = 2\alpha\omega_0/\mu_0\gamma$. Comparing equation (18) through equation (20) to equations (6), (8) and (9), it can be concluded that, for a given ferrite material, RPM sensor performance is independent of whether or not the demagnetization field is significant, even though the resonance frequency and quality factor are modified by the demagnetization.

Figure 3:
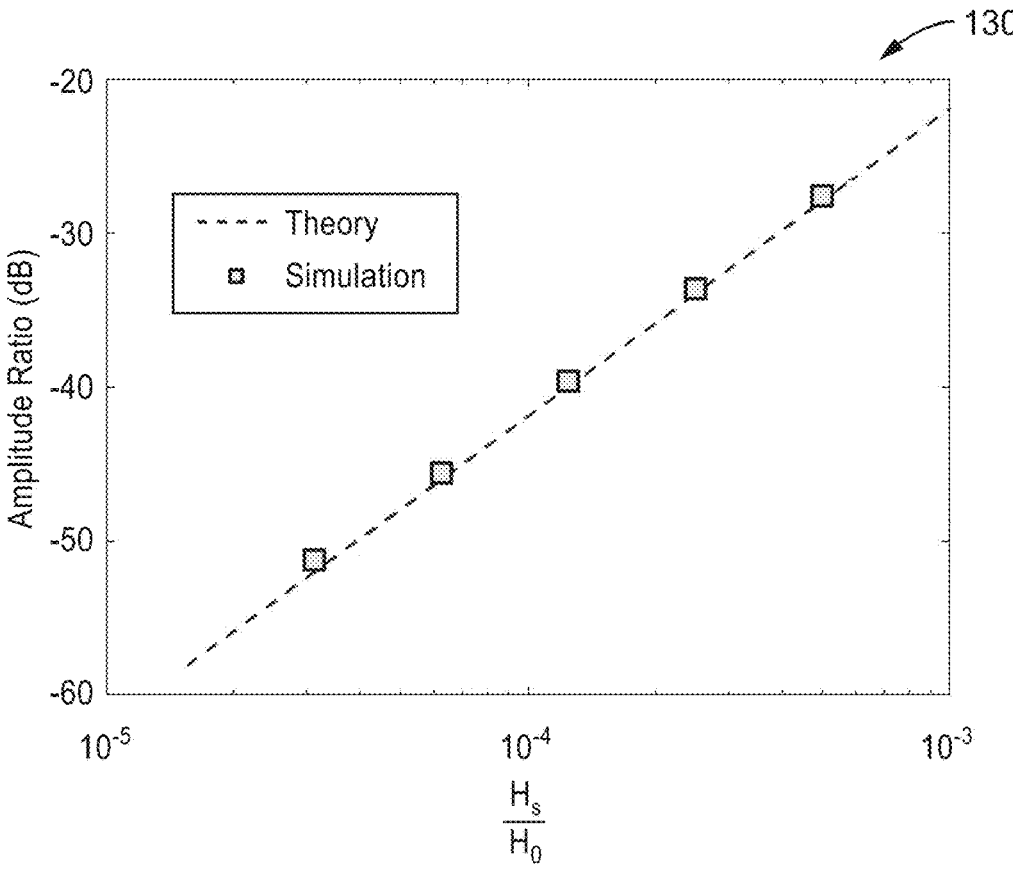
FIG. 3 are plots comparing theory versus simulations of magnetic field sensor operation using resonant precession modulation (RPM) principles which show high correlation between theory and the simulations.

FIG. 3 illustrates an example embodiment 130 comparing between theory and simulation of RPM operation, showing a plot of the transverse magnetization amplitude ratio for a component at the sum or difference frequency $f_0 \pm f_s$ to a component at the unmodulated precession frequency $f_0$. The dashed line represents results computed using equation (19) whereas the squares represent results obtained from micromagnetic simulation.

4. Advantages Over Conventional Inductive Coil Operation

The equations derived through theoretical analysis reveal a wealth of information regarding the origin and nature of the advantages of magnetic field sensor operation based on RPM as well as providing a means of quantifying some of these advantages. For example, equation (7) allows for the identification of two distinct sources from which transduced signal amplification may arise. The first of these sources, yielding the product term $$\left(\frac{M_s \sin(\theta)}{\Delta H}\right)$$

in equation (7), is the coupling of magnetization magnetic flux to the inductive detector, where amplification is achieved if this flux is larger than that which may be coupled directly due to the incident magnetic field. The second source, yielding the product term $$\frac{f_0}{f_s}$$

in equation (7), is the generation of magnetization terms of interest at $f_0 \pm f_s$ as a result of frequency mixing. With these frequencies typically being much larger than the incident magnetic field frequency $f_s$, it follows immediately from the principles of Faraday induction that larger transduced signals will be produced, all else being equal.

As a whole, amplification can be more naturally understood from the interpretation of RPM as a method of parametric amplification. In this context, magnetization is the output of a resonant system dependent on the parameter $H_e(t)$, where the perturbing magnetic field $H_p(t)$ behaves as the pump that harmonically drives the system and the electromagnetic wave magnetic field $h_s(t)$ serves to vary the system parameter such that parametric amplification ensues. It is finally noted that the sources of amplification have a remarkable elegance, originating directly from the magnetic material and intrinsic nonlinear nature of its magnetization dynamics, thus requiring no external equipment or circuitry to achieve.

For an approximate quantification of attainable values, consider the commonly used yttrium iron garnet (YIG) ferrite material biased such that $f_0$ is for example 1 GHz. At this frequency, it is reasonable to expect the linewidth $\Delta H$ of the material to be around 0.2 Oe (Oersted). Then, for the optimistic upper limit case of a highly perturbed, or in other words strongly pumped, magnetization with $\theta$ of 90 degrees, signal amplification by a factor upwards of 4000 is reached due solely to the coupling of magnetization magnetic flux. The total transduced signal amplification taking into account frequency mixing as well is then even larger and depends specifically on $f_s$.

Intimately related to the amplification advantage of magnetic field sensors based on RPM is their advantage of a physically compact size, where size may be characterized by the size of the inductive detection coil. Simply put, equation (5) indicates that the area A of the inductive detection coil may be reduced by at most the value of equation (7) while still maintaining a transduced signal strength larger than or equal to that of a conventional inductive coil of the original size A.

Also closely related to the amplification advantage is the sensitivity advantage of magnetic field sensors based on RPM. Again, the sources of amplification originate directly from the magnetic material and its intrinsic nonlinear magnetization dynamics. Distinct from conventional cases where amplification is achieved by external circuitry after the antenna which raises not only the signal amplitude but also the noise level, the amplification offered by the RPM scheme occurs in the material before the inductive detection coil where Johnson thermal noise and ferrite damping noise are generated, similar to the case of how a low noise amplifier is added before the antenna. Thus, transduced signal amplification is achieved without raising the noise generated by the inductive detection coil, immediately indicating a much-improved sensitivity as compared to inductive antennas operating under conventional principles.

As mentioned previously, the limit to sensitivity is ultimately determined by thermal noise generated by the ferrite loaded inductive detection coil. For an approximate quantification of achievable sensitivities, a thin film YIG material with a linewidth of 0.2 Oe, supposing a bias field of 70 Oe, corresponding to a thin film resonance frequency of 1 GHz, then equation (10) indicates that a power consumption of just −24 dBm will allow for sub-pT/Hz$^{1/2}$ sensitivity.

Of some merit is an explicit distinction between the advantages of RPM based magnetic field sensors and those of the previously mentioned conventional antennas incorporating ferrites. Among these previous antennas, the ferrite rod antenna is of particular interest due to its relative success and widespread usage as well as its architecture, which has some initial resemblance to that of the RPM based magnetic field sensors. The ferrite rod antenna consists of a conducting coil wrapped around a ferrite core, as illustrated in FIG. 2C, and operates entirely based upon conventional direct voltage induction. The ferrite core serves solely as a source of magnetization to magnify the magnetic flux that an incident magnetic field couples to the coil, likewise magnifying the transduced signal strength. In this regard, the ferrite rod antenna possesses the same advantages of amplification, size, and sensitivity compared to a conventional inductive coil as does the RPM based magnetic field sensors.

However, not only is the typical amplification achieved by a ferrite rod inductive coil quite low, falling in the range of approximately a factor of 50, but also the antenna is associated with significant magnetic losses that do not affect the RPM based magnetic field sensors. These losses arise from the fact that ferrite core of the ferrite rod inductive coil is unbiased and includes hysteresis loss, loss due to domain wall resonance, and loss due to thermally activated domain wall movements. The magnetic losses in the ferrite core become additional sources of thermal noise for conventional ferrite rod antennas while they are absent in the RPM based sensors as the ferrite is biased into saturation and free of domain wall movements. Furthermore, the lower amplification of the ferrite rod antenna immediately indicates lower sensitivity as well as lower potential size reduction as compared to the RPM based magnetic field sensors.

5. Considerations for Practical Implementation

For the purposes of tractability, a simplified scenario was maintained throughout much of the prior analyses and developments by making various assumptions. While most of these assumptions are easily maintained in practice, a particular few necessitate a thoughtful approach to implementation and consideration of phenomena previously neglected in order to hold to them. Perhaps chief amongst these phenomena is demagnetization. Demagnetization is an equivalent description of the dipole-dipole interaction between subatomic magnetic moments of the ferrite material and is in general dependent on the material shape, size, and magnetization orientation. Accounting for its effects on magnetization dynamics may be accomplished with an additive term $H_d(r,t)$ in the effective field of equation (1), written now as:

$$H_e(r,t)=H_0+h_s(t)+H_d(r,t) \tag{11}$$

where $H_d(r,t)$ is known as the demagnetization field and both $H_0$ and $h_s(t)$ are the familiar magnetic fields from prior analyses. Most notable about the demagnetization field in this context is the fact that it is in general spatially nonuniform, thus clearly invalidating the original assumption of a uniform $H_e(r,t)$ and giving rise to complications in the practical implementation of RPM. The ramifications of this nonuniformity can be approximately understood as a spatially nonuniform magnetization precession resonance frequency which not only destroys the phase coherence of $M(r,t)$ precession throughout the ferrite, but also introduces additional complicating phenomena such as exchange coupling. The resulting information that may be extracted from a detection of precession during RPM operation is thus significantly degraded in quality if not completely unusable.

The implementation approach taken to address the effects of demagnetization and maintain a uniform effective field involves an appropriate choice of ferrite shape. Specifically, the shape is selected such that, for all orientations of a uniform $M(t)$ occurring throughout normal RPM operation, $H_d(r,t)$ is either negligible in magnitude or approximately uniform in space. With several viable options that may satisfy these conditions, in at least one example embodiment it has been chosen to use ferrites with a thin film geometry for which in-plane orientations of $M(t)$ will yield a negligible demagnetization field whereas out of plane orientations will yield an approximately uniform demagnetization field. Any arbitrary orientation of $M(t)$ is effectively a superposition of an in-plane and an out of plane component and thus it is clear that the uniformity of $H_e(r,t)$ can always be maintained. Ferrites of a thin-film geometry, as compared to those of other potentially suitable shapes, have the additional benefit that associated processing methods such as pulsed laser deposition, spin spray plating, or liquid phase epitaxy are mature enough to produce films of extremely high quality.

With the complications accompanying demagnetization accounted for, all other details of practical implementation follow in a fairly straightforward manner. In this work, the bias field $H_0$, required to establish uniformity of $M(t)$ as well as a precession center frequency about which the modulation of RPM occurs, is applied with permanent magnets. The perturbation field $H_p(t)$, required to maintain $M(t)$ precession amid a finite magnetic loss, is applied using a conducting coil driven continuously at $f_0$ of equation (2). Lastly, inductive detection of magnetization dynamics, required to obtain an electrical signal from which information may be extracted, is performed with another conducting coil. With regards to this detection, it of interest to recognize that, since $H_d(r,t)$ is not always negligible throughout operation of RPM using a thin film ferrite, equation (13) indicates that it still has some effect on the magnetization precession dynamics. This effect is a modification of the precession such that it approximately resembles a pendulum oscillation as visualized in FIG. 1D. While this has no significant bearing on operation, it is of importance in deciding upon orientation of the inductive detector to achieve the largest transduced signal.

Figure 4:
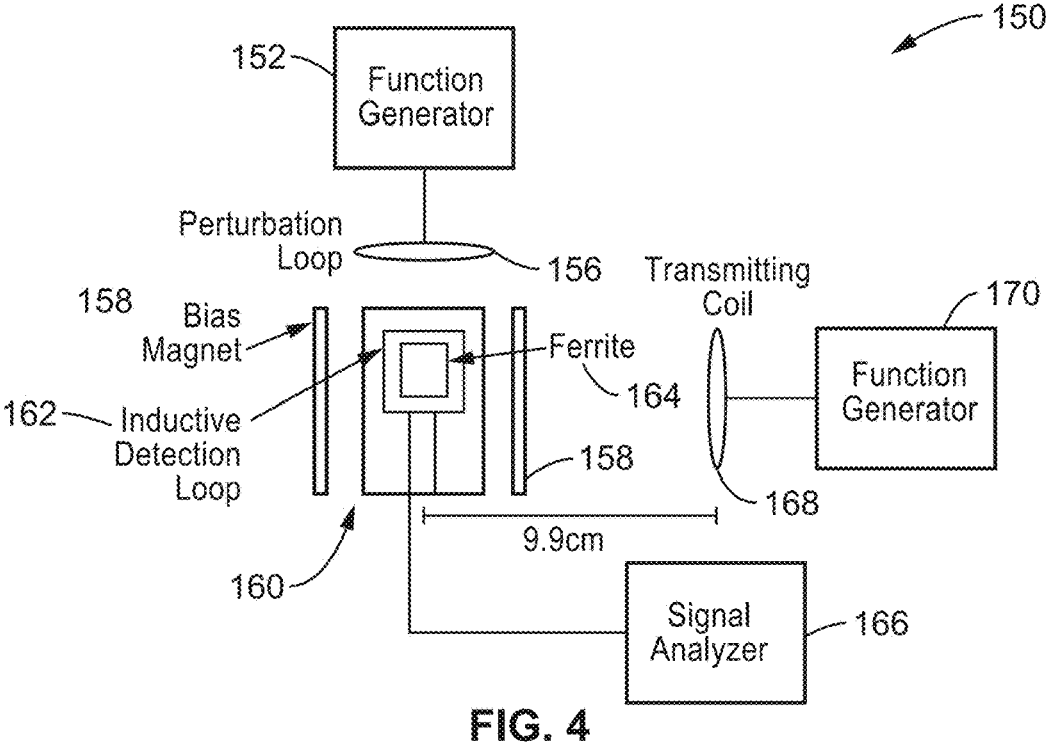
FIG. 4 is a schematic diagram of an RPM based magnetic field sensor implementation according to at least one embodiment of the present disclosure.

FIG. 4 illustrates an example embodiment 150 of an RPM based magnetic field sensor implementation. In at least one embodiment a subset of the hardware was implemented with a thin film yttrium iron garnet on a gadolinium gallium garnet substrate, with a loop used for inductive detection of ferrite magnetization dynamics in which the loop is used to produce the perturbation field and maintain magnetization precession.

A first signal generating source (e.g., function generator used in the test) 152 is coupled to a perturbation loop 156 which is proximal to the main portion of the magnetic field sensor 160 with its thin film ferrite 164 about which is an inductive detection loop 162, about which are positioned biasing magnets 158. A transmitting coil 168 is seen coupled to a function generator 170 for simulating a signal source to be received. A circuit 166 receives the output from the inductive detection loop and processes it to determine magnetic field information. In the figure this circuit is exemplified as a signal analyzer for the sake of testing.

Figure 5:
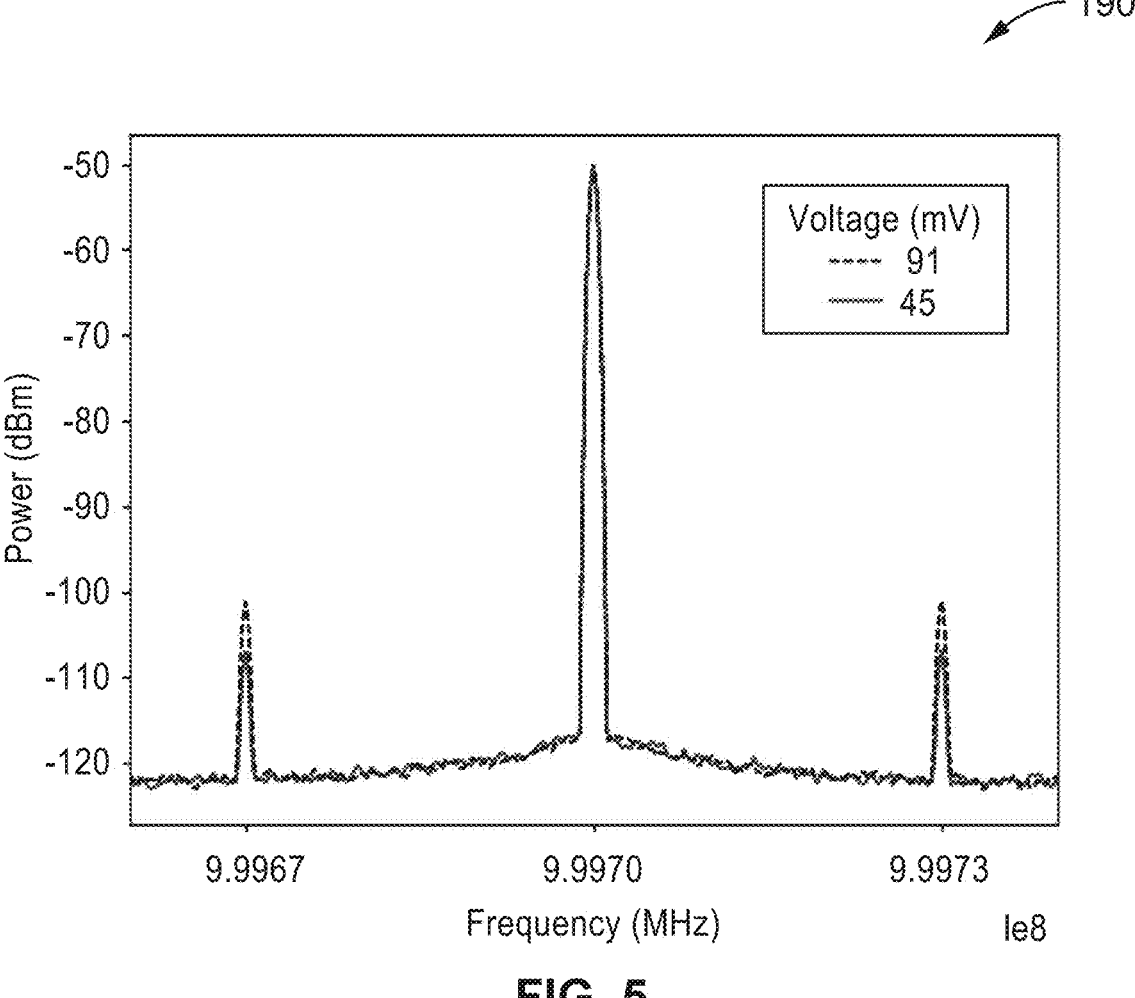
FIG. 5 are spectrum plots of power coupled to the inductive detection loop for a simulation of an RPM sensor according to at least one embodiment of the present disclosure, showing spectrum for driving coil voltages of 45 mV and 91 mV.

FIG. 5 illustrates an example 190 of received power spectrum for an embodiment of the disclosure. The figure depicts the spectrum of power coupled to the inductive detection loop. The solid line corresponds to driving the coil generating $h_s(t)$ with a voltage of 45 mV and the dotted line corresponds to driving the coil with a voltage of 91 mV. In both cases, the coil is driven at a frequency of 30 kHz. It should be appreciated that these voltages and frequencies are provided by way of example and not limitation.

5.2. Micromagnetic Simulation

As a means of evaluating the validity of the RPM concept, the analytical expressions describing its operation, and the approach to its practical implementation, micromagnetic simulations are performed. Specifically, simulations were carried out using the Object Oriented Micromagnetic Framework (OOMMF), which is a micromagnetic simulator widely used and well recognized as the standard for accurate solutions.

Reproducing the scenario visualized in FIG. 2A, a ferrite material is biased with a magnetic field $H_0$ of magnitude 50 Oe, resulting in a precession resonance frequency $f_0$ of 848

MHz. An electromagnetic wave magnetic field $h_s(t)$ is applied as a sinusoid with various amplitudes at a frequency of 50 kHz. Lastly, a perturbing magnetic field $H_p(t)$ is applied as a sinusoid with amplitude 0.025 Oe at a frequency of 848 MHz. It should be noted that the amplitude of $H_p(t)$ is somewhat arbitrary and need only to be sufficiently small such that it does not contribute significantly to the effective field. The amplitudes and frequency of $h_s(t)$ are similarly arbitrary to an extent and need only satisfy the conditions for which equation (4) was derived. In accordance with the approach to implementation taken to account for the effects of demagnetization, the ferrite is modeled to have a thin-film geometry, by way of example and not limitation, having dimensions 1×1×0.001 mm, with the material itself having the properties of YIG and a Gilbert damping coefficient α of 1e−3.

The proposed approach is best applied to sensors with small form factors with volume of less than 1 cm³, which can be easily fabricated with the existing material fabrication approaches.

These test simulations were performed for a total time of 0.2 milliseconds for each $h_s(t)$ amplitude of interest from which the transverse magnetization component $M_t(t)$ is extracted and the ratio of $$M_t^{f_0 \pm f_s}$$

to $$M_t^{f_0}$$

is determined. This ratio is also computed theoretically from equation (19) using the quality factor Q from equation (15) which is of unmodulated precession for a thin film ferrite, and a comparison with the simulation results seen plotted in FIG. 3. The simulations not only demonstrate that the concept of RPM is feasible and support the proposed approach to deal with the effects of demagnetization, but also FIG. 3 shows an excellent agreement between simulation and theory 3 which validates the developed analytical expressions.

5.3. Example Implementation

A magnetic field sensor operating based on RPM is implemented using available hardware and materials. Results from experiments using the sensor provide further evidence supporting the feasibility of RPM based operation, validate the practical applicability of the developed RPM theory, and are already able to demonstrate significant advantages over conventional inductive coil operation.

The experimental setup that was shown in FIG. 4 employs an epitaxially grown YIG thin film ferrite of dimensions 3.5×5×0.003 mm corresponding to a sensor volume of 0.0525 mm³. It will be appreciated that the material and dimensions are provided by way of example and different ferrite materials with different dimensions can be utilized without departing from the teachings of the present disclosure.

In the example described, inductive detection of the transverse component of magnetization $M_t(t)$ was accomplished with a single turn loop of area 6 mm² constructed from a piece of copper soldered onto traces fabricated on a Rogers 4003C board. Two neodymium permanent magnets were used to apply the bias magnetic field $H_0$ with a magnitude of approximately 70 Oe, corresponding to a measured precession resonance frequency of approximately 1 GHz. The field $h_s(t)$ is generated from a 125-turn coil of area 3375 mm² positioned 9.9 cm from the center of the inductive detection loop and driven by a function generator. Lastly, the perturbation field $H_p(t)$ is applied with a single turn loop of area 95 mm² fabricated on a Rogers 4003C board and driven by a function generator for the sake of this testing. For all results from this setup, the perturbation loop was driven sinusoidally at the precession resonance frequency to deliver—55 dBm of power to the sensor whereas the coil generating $h_s(t)$ was driven sinusoidally with varied voltages and frequencies to evaluate trends in the behavior of the system. It should be appreciated that the above provides examples used in testing but do not otherwise limit the practice of the present disclosure.

In FIG. 5 is shown the power coupled to the inductive detection loop for the cases of the coil generating $h_s(t)$ driven with voltages of 91 mV and 45 mV across its terminals at a frequency of 30 kHz. In both cases, the expected sum and difference frequency terms $f_0 \pm f_s$ as well as the unmodulated frequency term $f_0$ are clearly evident, demonstrating that RPM operation is achieved. Comparing between the two cases then it is seen that doubling the driving voltage effectively doubles the amplitude ratio of equation (8). Recognizing that the driving voltage is directly proportional to the $h_s(t)$ field amplitude $H_s$ by antenna theory, then the linear relationship between the amplitude ratios and $H_s$ is thus confirmed.

Table 1, shown at the end of the specification, presents additional detailed data of this ratio, obtained by driving the coil with various combinations of voltages and frequencies, and provides a comparison with theoretical expectations. The theoretical expectations were computed using equation (8) where $H_0$, $H_s$ and Q were determined through procedures detailed in a previous section. This table shows outstanding agreement between the computed values and those experimentally observed, solidifying the validity of the developed RPM theory as well as its applicability to a practical implementation.

For the purposes of comparison and assessment of the performance of the RPM based magnetic field sensor, the inductive detection loop of the RPM implementation was also operated under conventional receiving antenna principles in a second experimental setup. This setup essentially involves the same incident magnetic field as in the first experimental setup now directly inducing voltages in the inductive detection loop in order to achieve transduction into electrical signals. This field is generated by the same coil driven sinusoidally by a function generator with the same voltages and frequencies as previously exemplified. The same 9.9 cm distance separates the inductive detection loop from the coil. Based on a comparison of the received signals observed to those of the first setup, an amplification metric is computed and presented in Table 2. From this table, it is seen that significant amplification is achieved for all cases under consideration, demonstrating promise for RPM based magnetic field sensor applications in the very low frequency (VLF) and low frequency (LF) bands. It is also possible to conclude from Table 2 that amplification grows as the coil driving frequency decreases, as expected from equation (7). It is further noted that the amplification can easily be increased with an increase in pumping power.

Figure 6:
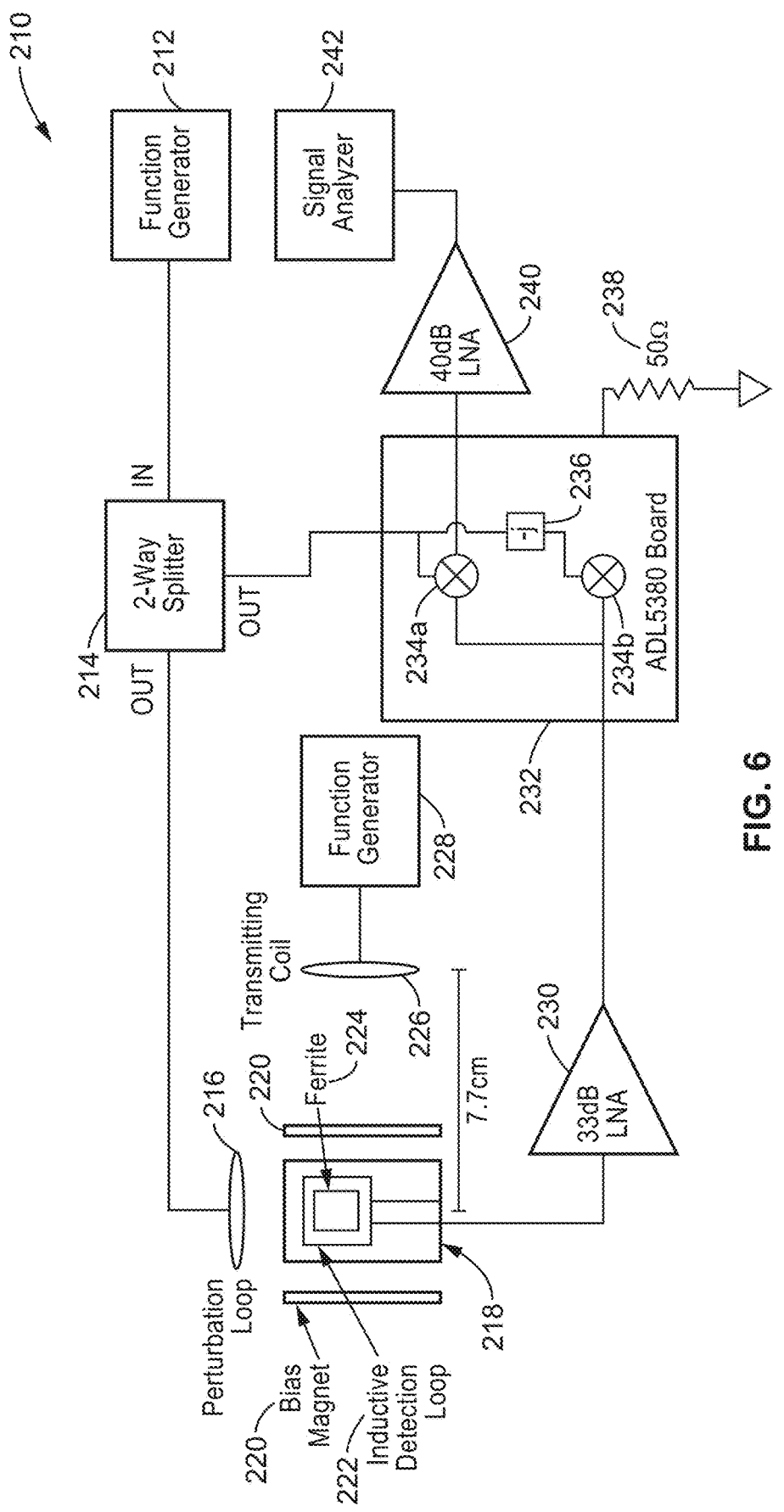
FIG. 6 is a schematic of a setup for measurement of sensor sensitivity of an RPM sensor according to an embodiment of the present disclosure.

FIG. 6 illustrates an example embodiment 210 showing an experimental setup for measurement of sensitivity for the RPM based magnetic field sensor.

This setup resembles that of FIG. 4 in the configuration of the sensor 218, the biasing magnets 220 (for static $H_0$), and the perturbation loop 216 (generating $h_s(t)$), with the caveat that the distance between the coil 226 (driven by transmitter generator source 228) and the inductive detection loop 222 of sensor 218 in this example is 7.7 cm. However, the setup of FIG. 4 as it stood was not suitable for measurements of sensitivity, since the noise floor would be limited by phase noise of the function generator producing the perturbation field. Consequently, the received signals at the sum and difference frequencies $f_0 \pm f_s$ were coherently demodulated down to baseband $f_s$ using an Analog Devices ADL5380 evaluation board 232, shown with internal mixers 234*a*, 234*b* and quadrature phase splitter 236.

The inductive detection loop 222 is connected to the radio frequency port of the board 232 through an amplifier depicted as a 33 dB low noise amplifier (LNA) 230. The perturbation loop 216 was driven by a function generator 212 through a 2-way power splitter 214, with the other output of the splitter connecting to the local oscillator port of the evaluation board 232. The in-phase output of the board 232 is connected to a signal analyzer 242 through an LNA, such as 40 dB LNA 240, and the quadrature-phase output of the board is terminated with 50 Ohms 238.

For all results of this setup, the perturbation loop was driven sinusoidally at the precession resonance frequency of 1 GHz to deliver −40.96 dBm of power to the sensor whereas the coil generating $h_s(t)$ was driven sinusoidally with a voltage of 0.45 mV across its terminals at 10 kHz. This yielded a demodulated signal with a signal-to-noise ratio (SNR) of 41.5 dB, from which sensitivity may be computed to be 27.1 pT/Hz$^{1/2}$. It is noted that this sensitivity was found to be fairly constant with varying frequency, as expected based on equation (20). Comparing conventional ferrite rod antennas operating at similar frequencies, the ferrite rod antennas can achieve a sensitivity about two to three orders of magnitude better than the disclosed RPM based sensor, but they require a volume six orders of magnitude greater. The theoretical sensitivity was calculated using a modified version of equation (20) that accounts for the hardware and electronics of the setup, yielding a value of 15.7 pT/Hz$^{1/2}$. The details of this calculation are presented in the methods section.

6. Summary Discussion

Magnetic field sensors based on RPM are introduced and their principal advantages in amplification, sensitivity, and size as compared to receiving antennas operating under conventional principles have been demonstrated herein. The general concept of RPM operation has proven to be viable through both simulation and experiment. With the RPM based magnetic field sensor implementation in this disclosure being of a rather simple makeshift nature, it is expected that further refinements will only establish the practical capabilities of these antennas more substantially. For example, an inductive detector design that mitigates shielding effects on the ferrite material will result in a larger transduced signal as would alternatively or additionally provide an increase in the ferrite material volume. Most promising about RPM based magnetic field sensor operation is the fact that it is fundamentally different from conventional antenna operation, possessing the potential to contribute a completely new paradigm to low frequency antenna design and overcome longstanding barriers in performance.

6.1 Methods

Theoretical amplitude ratio. The amplitude ratios of Table 1 were computed theoretically using equation (19). The value of $H_0$ was found with a DC gaussmeter. The values of $H_s$ were found through measurement of the current through the coil producing the field of interest followed by application of the Biot-Savart law. The value of Q was computed as the inverse of the 3 dB bandwidth of the loaded RPM sensor. This bandwidth was measured using a vector network analyzer under a 70 Oe biasing field. All values are provided in Table 4.

6.2 Theoretical Sensitivity

The theoretical sensitivity was computed using equation (21). The value of $\Delta H$ was found using the definition $\Delta H = 4\pi\alpha f_0/\mu_0\gamma$ with the value of $\alpha$ found using equation (16), and the value of Q found as that of the unloaded RPM sensor. The sensor is matched to 50 Ohms, so this unloaded Q has a value twice that of the loaded Q. The value of $P_p$ was found based on measurements using a vector network analyzer under a 70 Oe biasing field. All values are provided in Table 6.

7. Supplementary Notes

7.1 Supplementary Note 1

Inductive sensor sensitivity derivation and comparison.

The noise of an inductive sensor is dominated by Johnson thermal noise produced by the inductive detector. Following a procedure analogous to the derivation of sensitivity for the RPM sensor, the sensitivity of the inductive sensor corresponds to the RMS field of interest $H_s/\sqrt{2}$, where $H_s$ is such that $$V_{ind} = \sqrt{4kTR} \tag{20}$$

where R is the ohmic resistance of the inductive detector. Applying equation (7) of the main manuscript and again recognizing that sensitivity is typically expressed in terms of magnetic flux densities by convention, then equation (20) can be written as $$NA\delta B_{s,ind}\omega_s = \sqrt{4kTR} \tag{21}$$

where $NA\delta B_{s,ind}$ is the sensitivity. To also handle ferrite inductive sensors, an additional factor corresponding to the relative permeability of the ferrite $\mu_r$ is included in $V_{ind}$, leading to the more general expression $$\mu_r NA\delta B_{s,ind}\omega_s = \sqrt{4kTR} \tag{22}$$

The sensitivity can be written explicitly from equation (22) as $$\delta B_{s,ind} = \sqrt{\frac{kTR}{\mu_r^2 N^2 A^2 \omega_s^2}} \tag{23}$$

and then made more practical for computation by employing the equations $$L_{ind} = \frac{\mu_r \mu_0 N^2 A}{l} \quad (24)$$

$$Q_{ind} = \frac{\omega_s L_{ind}}{R} \quad (25)$$

These equations describe the coil inductance and quality factor at $f_s$ respectively, where $l$ is the axial length of the coil. Substituting equations (24) and (25) into equation (23) yields the final equation $$\delta B_{s,ind} = \sqrt{\frac{4\mu_0 kT}{\mu_r \omega_s v Q_{ind}}} \quad (26)$$

An expression comparing the sensitivity of the inductive sensor to that of the RPM sensor can then be obtained by taking the ratio of equation (26) to equation (21) to yield $$\frac{\delta B_{s,ind}}{\delta B_{s,RPM}} = \frac{1}{\Delta H} \sqrt{\frac{2P_p}{\mu_r \mu_0 v \omega_s Q_{ind}}}. \quad (27)$$

7.2 Supplementary Note 2

7.2.1 Experimental Sensitivity Computation

The experimental sensitivity $\delta B_{s,exp}$ is computed using the amplitude $H_s$ of the field of interest, a noise de-embedding factor X, and the measured signal-to-noise ratio SNR using $$\delta B_{s,exp} = X \frac{\mu_0 H_s}{\sqrt{2SNR}} \quad (28)$$

The amplitude $H_s$ is found by applying the Biot-Savart law as $$H_s = \frac{NI}{4\pi} \int \frac{\partial l' \times \hat{r}}{r^2} \quad (29)$$

where N is the number of turns of the coil producing the field of interest, I is the current amplitude through the coil, r is the vector from the coil to the field observation point, and $\partial l'$ is a length of the coil directed along the direction of current flow. The current amplitude I is measured using a current probe and $H_s$ is then computed using equation (29) and the geometry of the coil.

The theoretical sensitivity of equation (21) corresponds to noise dominated by the sensor noise; however, noise of the second experimental setup is dominated by that of the first LNA connected to the RPM sensor. In order to compare experimental and theoretical sensitivities, the LNA noise is de-embedded using the factor X, defined as $$X = \frac{V_{n,RPM}}{\sqrt{V_{n,RPM}^2 + V_{n,LNA}^2}} \quad (30)$$

where $V_{n,RPM}$ is the RMS output noise voltage of the RPM sensor and $V_{n,LNA}$ is the RMS input noise voltage of the first LNA. All values are provided in Table 5.

7.3 Supplementary Note 3

Figure 7:
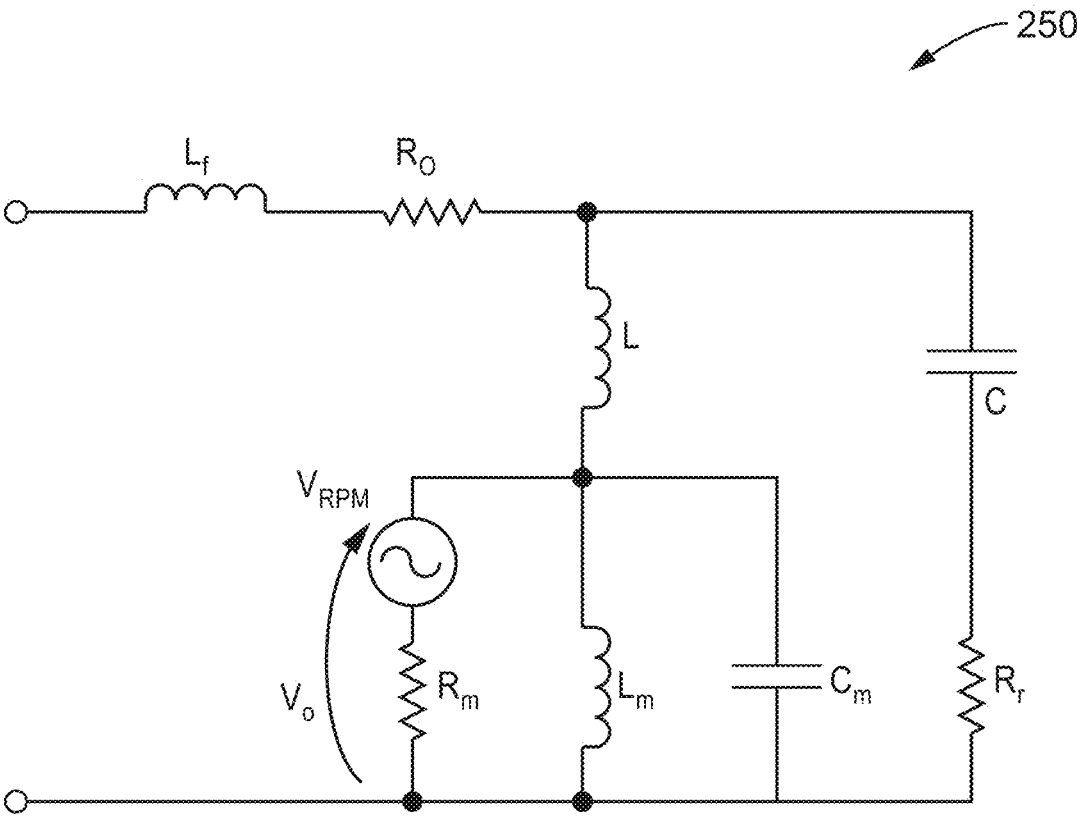
FIG. 7 is an equivalent circuit model of an experimental RPM sensor according to at least one embodiment of the present disclosure.

In FIG. 7 is shown a circuit model of the experimental RPM sensor, where $V_0$ and $V_{RPM}$ are the voltages as defined in equation (9), and where the component values are provided in Table 3.

Embodiments of the present technology may be described herein with reference to flowchart illustrations of methods and systems according to embodiments of the technology, and/or procedures, algorithms, steps, operations, formulae, or other computational depictions, which may also be implemented as computer program products. In this regard, each block or step of a flowchart, and combinations of blocks (and/or steps) in a flowchart, as well as any procedure, algorithm, step, operation, formula, or computational depiction can be implemented by various means, such as hardware, firmware, and/or software including one or more computer program instructions embodied in computer-readable program code. As will be appreciated, any such computer program instructions may be executed by one or more computer processors, including without limitation a general purpose computer or special purpose computer, or other programmable processing apparatus to produce a machine, such that the computer program instructions which execute on the computer processor) or other programmable processing apparatus create means for implementing the function) specified.

Accordingly, blocks of the flowcharts, and procedures, algorithms, steps, operations, formulae, or computational depictions described herein support combinations of means for performing the specified function), combinations of steps for performing the specified function), and computer program instructions, such as embodied in computer-readable program code logic means, for performing the specified function). It will also be understood that each block of the flowchart illustrations, as well as any procedures, algorithms, steps, operations, formulae, or computational depictions and combinations thereof described herein, can be implemented by special purpose hardware-based computer systems which perform the specified function) or step), or combinations of special purpose hardware and computer-readable program code.

Furthermore, these computer program instructions, such as embodied in computer-readable program code, may also be stored in one or more computer-readable memory or memory devices that can direct a computer processor or other programmable processing apparatus to function in a particular manner, such that the instructions stored in the computer-readable memory or memory devices produce an article of manufacture including instruction means which implement the function specified in the block) of the flowchart). The computer program instructions may also be executed by a computer processor or other programmable processing apparatus to cause a series of operational steps to be performed on the computer processor or other programmable processing apparatus to produce a computer-implemented process such that the instructions which execute on the computer processor or other programmable processing apparatus provide steps for implementing the functions specified in the block) of the flowchart), procedure) algorithm), step), operation), formula(e), or computational depiction).

It will further be appreciated that the terms "programming" or "program executable" as used herein refer to one or more instructions that can be executed by one or more computer processors to perform one or more functions as described herein. The instructions can be embodied in software, in firmware, or in a combination of software and firmware. The instructions can be stored local to the device in non-transitory media, or can be stored remotely such as on a server, or all or a portion of the instructions can be stored locally and remotely. Instructions stored remotely can be downloaded (pushed) to the device by user initiation, or automatically based on one or more factors.

It will further be appreciated that as used herein, that the terms processor, hardware processor, computer processor, central processing unit (CPU), and computer are used synonymously to denote a device capable of executing the instructions and communicating with input/output interfaces and/or peripheral devices, and that the terms processor, hardware processor, computer processor, CPU, and computer are intended to encompass single or multiple devices, single core and multicore devices, and variations thereof.

From the description herein, it will be appreciated that the present disclosure encompasses multiple implementations of the technology which include, but are not limited to, the following:

A method comprising detecting a weak very low frequency (VLF) magnetic field based on spin precession modulation (SPM) of electron resonance frequency or resonant precession modulation (RPM).

A method for detecting a weak very low frequency (VLF) magnetic field based on spin precession modulation (SPM) of electron resonance frequency or resonant precession modulation (RPM), the method comprising: (a) designating a biasing direction; (b) adding a dynamic VLF magnetic field along the biasing direction wherein the electron resonance frequency is modulated, and wherein a frequency modulated signal is generated with a spectrum that has two primary sidetones beside an original electron resonance spectral line; (c) wherein the sidetones contain both amplitude and phase information of the original weak VLF field a carrier frequency upconverted by the resonance; and (d) detecting one of the two sidetones with a pickup coil wherein a higher sensitivity results compared to detecting the original VLF field with a coil.

A very low frequency (VLF) antenna apparatus based on spin precession modulation (SPM) of electron resonance frequency or resonant precession modulation (RPM).

An apparatus for detecting weak very low frequency (VLF) signals based on spin precession modulation (SPM) of electron resonance frequency or resonant precession modulation (RPM), the antenna comprising: (a) first, second and third loop antennas; (b) the loop first and second loop antennas oriented to be co-axial and spaced apart; (c) a magnetic spin source positioned within the first loop antenna; (d) a magnetic biasing source; (e) a pump source coupled to the second loop antenna; and (f) the third loop antenna configured for coupling to a VLF field.

An apparatus for detecting weak very low frequency (VLF) signals based on spin precession modulation (SPM) of electron resonance frequency or resonant precession modulation (RPM), the antenna comprising: (a) first and second loop antennas; (b) the loop antennas oriented to be co-axial and spaced apart; (c) a magnetic biasing source; (d) a pump source coupled to the second loop antenna; and (e) the first loop antenna configured for coupling to a VLF field.

An apparatus for detecting weak very low frequency (VLF) signals based on spin precession modulation (SPM)

of electron resonance frequency or resonant precession modulation (RPM), the antenna comprising: (a) first, second and third loop antennas; (b) the loop first and second loop antennas oriented to be co-axial and spaced apart; (c) a magnetic spin source positioned within the first loop antenna; (d) a magnetic biasing source; (e) a pump source coupled to the second loop antenna; and (f) the third loop antenna configured for coupling to a VLF field.

The apparatus or method of any preceding implementation, further comprising: (a) designating the biasing direction as the Z-direction; (b) wherein the biasing field and initial magnetization is along the Z-direction; (c) applying a circularly polarized microwave pulse with a length of $\pi/2$ at the frequency of the ferromagnetic resonance frequency with a pair of orthogonally placed coils and rotating the magnetization by 90 degrees into the X-Y plane; (d) removing the microwave pulse wherein free precession begins; and (e) during free precession, adding the VLF field along the biasing direction wherein the VLF field modulates the magnetization precession and is captured with said orthogonally placed set of coils.

The apparatus or method of any preceding implementation, wherein said apparatus is configured for performing steps comprising detecting a weak very low frequency (VLF) magnetic field based on spin precession modulation (SPM) of electron resonance frequency or resonant precession modulation (RPM).

The apparatus or method of any preceding implementation, wherein said apparatus is configured for performing steps comprising: (a) designating a biasing direction; (b) adding a dynamic VLF magnetic field along the biasing direction wherein the electron resonance frequency is modulated, and wherein a frequency modulated signal is generated with a spectrum that has two primary sidetones beside an original electron resonance spectral line; (c) wherein the sidetones contain both amplitude and phase information of the original weak VLF field a carrier frequency upconverted by the resonance; and (d) detecting one of the two sidetones with a pickup coil wherein a higher sensitivity results compared to detecting the original VLF field with a coil.

The apparatus or method of any preceding implementation, wherein said apparatus is configured for performing steps comprising: (a) designating the biasing direction as the Z-direction; (b) wherein the biasing field and initial magnetization is along the Z-direction; (c) applying a circularly polarized microwave pulse with a length of $\pi/2$ at the frequency of the ferromagnetic resonance frequency with a pair of orthogonally placed coils and rotating the magnetization by 90 degrees into the X-Y plane; (d) removing the microwave pulse wherein free precession begins; and (e) during free precession, adding the VLF field along the biasing direction wherein the VLF field modulates the magnetization precession and is captured with said orthogonally placed set of coils.

The apparatus or method of any preceding implementation, wherein said apparatus is configured for performing steps comprising detecting a weak very low frequency (VLF) magnetic field based on spin precession modulation (SPM) of electron resonance frequency or resonant precession modulation (RPM).

Implementations include each and every embodiment of the technology described herein, as well as any aspect, component, or element of any embodiment described herein, and any combination of aspects, components or elements of any embodiment described herein.

As used herein, term "implementation" is intended to include, without limitation, embodiments, examples, or other forms of practicing the technology described herein.

As used herein, the singular terms "a," "an," and "the" may include plural referents unless the context clearly dictates otherwise. Reference to an object in the singular is not intended to mean "one and only one" unless explicitly so stated, but rather "one or more."

Phrasing constructs, such as "A, B and/or C", within the present disclosure describe where either A, B, or C can be present, or any combination of items A, B and C. Phrasing constructs indicating, such as "at least one of" followed by listing a group of elements, indicates that at least one of these group elements is present, which includes any possible combination of the listed elements as applicable.

References in this disclosure referring to "an embodiment", "at least one embodiment" or similar embodiment wording indicates that a particular feature, structure, or characteristic described in connection with a described embodiment is included in at least one embodiment of the present disclosure. Thus, these various embodiment phrases are not necessarily all referring to the same embodiment, or to a specific embodiment which differs from all the other embodiments being described. The embodiment phrasing should be construed to mean that the particular features, structures, or characteristics of a given embodiment may be combined in any suitable manner in one or more embodiments of the disclosed apparatus, system or method.

As used herein, the term "set" refers to a collection of one or more objects. Thus, for example, a set of objects can include a single object or multiple objects.

Relational terms such as first and second, top and bottom, and the like may be used solely to distinguish one entity or action from another entity or action without necessarily requiring or implying any actual such relationship or order between such entities or actions.

The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element.

As used herein, the terms "approximately", "approximate", "substantially", "essentially", and "about", or any other version thereof, are used to describe and account for small variations. When used in conjunction with an event or circumstance, the terms can refer to instances in which the event or circumstance occurs precisely as well as instances in which the event or circumstance occurs to a close approximation. When used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" aligned can refer to a range of angular variation of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values may sometimes be presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio in the range of about 1 to about 200 should be understood to include the explicitly recited limits of about 1 and about 200, but also to include individual ratios such as about 2, about 3, and about 4, and sub-ranges such as about 10 to about 50, about 20 to about 100, and so forth.

The term "coupled" as used herein is defined as connected, although not necessarily directly and not necessarily mechanically. A device or structure that is "configured" in a certain way is configured in at least that way, but may also be configured in ways that are not listed.

Benefits, advantages, solutions to problems, and any element) that may cause any benefit, advantage, or solution to occur or become more pronounced are not to be construed as a critical, required, or essential features or elements of the technology describes herein or any or all the claims.

In addition, in the foregoing disclosure various features may grouped together in various embodiments for the purpose of streamlining the disclosure. This method of disclosure is not to be interpreted as reflecting an intention that the claimed embodiments require more features than are expressly recited in each claim. Inventive subject matter can lie in less than all features of a single disclosed embodiment.

The abstract of the disclosure is provided to allow the reader to quickly ascertain the nature of the technical disclosure. It is submitted with the understanding that it will not be used to interpret or limit the scope or meaning of the claims.

It will be appreciated that the practice of some jurisdictions may require deletion of one or more portions of the disclosure after that application is filed. Accordingly the reader should consult the application as filed for the original content of the disclosure. Any deletion of content of the disclosure should not be construed as a disclaimer, forfeiture or dedication to the public of any subject matter of the application as originally filed.

The following claims are hereby incorporated into the disclosure, with each claim standing on its own as a separately claimed subject matter.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

All structural and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

TABLE 1

Amplitude Ratio Results and Theory

| Voltage (mV) | Frequency (kHz) | Experimental Ratio (dB) | Theoretical Ratio (dB) |
|---|---|---|---|
| 45 | 10 | −47.31 | −46.89 |
| | 30 | −56.82 | −56.64 |
| | 50 | −61.91 | −61.08 |
| 91 | 10 | −41.44 | −40.87 |
| | 30 | −50.96 | −50.62 |
| | 50 | −55.52 | −55.06 |

TABLE 2

Amplification Results

| Frequency (kHz) | Amplification (dB) |
|---|---|
| 10 | +22.19 |
| 30 | +17.00 |
| 50 | +13.37 |

TABLE 3

Component Values for Circuit Model (FIG. 7) of RPM Sensor Biased for a 710 MHz Resonance Frequency

| Component | Description | Value |
|---|---|---|
| $L_f$ | Inductance of detector feeding | 6.1883 nH |
| L | Inductance of detector | 0.7640 nH |
| $R_0$ | Ohmic resistance of detector | 1.0717 Ω |
| C | Capacitance of detector | 0.1287 pF |
| $R_r$ | Radiation resistance | 3.4124 Ω |
| $L_m$ | Effective inductance of ferrite | 0.1485 nH |
| $R_m$ | Effective resistance of ferrite | 118.96 Ω |
| $C_m$ | Effective capacitance of ferrite | 0.3380 nF |

TABLE 4

Theoretical Amplitude Ratio Calculation Variable Values

| Variable | Description | Value | |
|---|---|---|---|
| $H_0$ | Biasing field | 70 Oe | |
| $M_s$ | Saturation magnetization | 140 kA/m | |
| Q | Unloaded quality factor | 135.95 | |

Signal field at various voltages and frequencies

| | Voltage | Freq. | |
|---|---|---|---|
| $H_s$ | 1 V | 10 kHz | 357.1 mA/m |
| | | 30 kHz | 116.2 mA/m |
| | | 50 kHz | 69.7 mA/m |
| | 2 V | 10 kHz | 714.2 mA/m |
| | | 30 kHz | 232.5 mA/m |
| | | 50 kHz | 139.4 mA/m |

TABLE 5

Sensitivity Calculation Variable Values

| Variable | Description | Value |
|---|---|---|
| I | Current Amplitude | 61.82 uA |
| $H_s$ | Field of Interest amplitude | 8.59 nT |
| SNR | Signal-to-noise ratio | 41.51 dB |
| X | De-embedding factor | 0.531 |
| $V_{n,\,RPM}$ | RPM sensor output noise voltage | 0.895 nV/Hz$^{1/2}$ |
| $V_{n,\,LNA}$ | LNA input noise voltage | 1.429 nV/Hz$^{1/2}$ |

TABLE 6

Theoretical Sensitivity Calculation Variable Values

| Variable | Description | Value |
|---|---|---|
| $H_0$ | Biasing field | 70 Oe |
| $M_s$ | Saturation magnetization | 140 kA/m |
| ΔH | Linewidth | 0.496 Oe |
| Q | Unloaded quality factor | 271.9 |
| $P_p$ | Pumping power | −40.957 dBm |
| T | Temperature | 290 K |

What is claimed is:

1. An apparatus for detecting weak very low frequency (VLF) signals based on spin precession modulation (SPM) of electron resonance frequency or resonant precession modulation (RPM), comprising:

(a) first and second loop antennas;

(b) the loop antennas oriented to be co-axial and spaced apart;

(c) a magnetic biasing source;

(d) a ferrite material that is biased by the magnetic biasing source into saturation and which is enclosed by the first loop antenna;

(e) a pump source coupled to the second loop antenna;

(f) the first loop antenna configured for detecting precession modulation, and performing steps comprising:

(i) designating a biasing direction;

(ii) adding a dynamic VLF magnetic field along the biasing direction wherein an electron resonance frequency is modulated, and wherein a frequency modulated signal is generated with a spectrum that has two primary sidetones beside an original electron resonance spectral line;

wherein the sidetones contain both amplitude and phase information of an original weak VLF magnetic field at a carrier frequency upconverted by the resonance; and (iv) detecting one of the two sidetones wherein a higher sensitivity results compared to detecting the original weak VLF magnetic field with a coil.

2. An apparatus for detecting weak very low frequency (VLF) signals based on spin precession modulation (SPM) of electron resonance frequency or resonant precession modulation (RPM), comprising:

(a) first and second loop antennas;

(b) the loop antennas oriented to be co-axial and spaced apart;

(c) a magnetic biasing source;

(d) a ferrite material that is biased by the magnetic biasing source into saturation and which is enclosed by the first loop antenna;

(e) a pump source coupled to the second loop antenna;

(f) the first loop antenna configured for detecting precession modulation, and performing steps comprising:

(i) designating a biasing direction as the Z-direction;

(ii) wherein a biasing field and an initial magnetization are along the Z-direction;

(iii) applying a circularly polarized microwave pulse with a length of $\pi/2$ at a frequency of a ferromagnetic resonance frequency and rotating magnetization by 90 degrees into an X-Y plane;

(iv) removing the microwave pulse wherein free precession begins; and (v) during free precession, adding a VLF field along the biasing direction wherein the VLF field modulates the magnetization precession and is captured with the first loop antenna.

3. An apparatus for detecting weak very low frequency (VLF) signals based on spin precession modulation (SPM) of electron resonance frequency or resonant precession modulation (RPM), comprising:

(a) a loop antenna as inductive detector;

(b) a magnetic biasing source;

(c) a ferrite material that is biased by the magnetic biasing source into saturation and which is enclosed by the loop antenna as inductive detector;

(d) a pump source coupled to the loop antenna; and (e) the loop antenna configured for detecting precession modulation, by performing steps comprising:

(i) designating a biasing direction;

(ii) adding a dynamic VLF magnetic field along the biasing direction wherein an electron resonance frequency is modulated, and wherein a frequency modulated signal is generated with a spectrum that has two primary sidetones beside an original electron resonance spectral line;

wherein the sidetones contain both amplitude and phase information of an original weak VLF field and a carrier frequency upconverted by resonance; and (iv) detecting one of the two sidetones with a pickup coil wherein a higher sensitivity results compared to detecting an original VLF field with said loop antenna.

4. An apparatus for detecting weak very low frequency (VLF) signals based on spin precession modulation (SPM) of electron resonance frequency or resonant precession modulation (RPM), comprising:

(a) a loop antenna as an inductive detector;

(b) a magnetic biasing source;

(c) a ferrite material that is biased by the magnetic source into saturation and which is enclosed by the single loop antenna;

(d) a pump source coupled to the loop antenna; and (e) the loop antenna configured for detecting precession modulation and performing steps comprising:

(i) designating a biasing direction as the Z-direction;

(ii) wherein a biasing field and initial magnetization are along the Z-direction;

applying a circularly polarized microwave pulse with a length of $\pi/2$ at a frequency of a ferromagnetic resonance frequency with a pair of orthogonally placed coils and rotating magnetization by 90 degrees into an X-Y plane;

(iv) removing the microwave pulse wherein free precession begins; and (v) during free precession, adding a VLF field along the biasing direction wherein the VLF field modulates magnetization precession and is captured with said orthogonally placed set of coils.

5. An apparatus for detecting weak very low frequency (VLF) signals based on spin precession modulation (SPM) of electron resonance frequency or resonant precession modulation (RPM), comprising:

(a) first and second loop antennas;

(b) the loop antennas oriented to be co-axial and spaced apart;

(c) a magnetic biasing source;

(d) a pump source coupled to the second loop antenna;

(e) the first loop antenna configured for coupling to a VLF field;

(f) wherein said apparatus is configured for performing steps comprising:

(i) designating a biasing direction;

(ii) adding a dynamic VLF magnetic field along a biasing direction wherein the electron resonance frequency is modulated, and wherein a frequency modulated signal is generated with a spectrum that has two primary sidetones beside an original electron resonance spectral line;

(iii) wherein the sidetones contain both amplitude and phase information of an original weak VLF field at a carrier frequency upconverted by the resonance; and (iv) detecting one of the two sidetones with a pickup coil wherein a higher sensitivity results compared to detecting the original VLF field with a coil.

6. The apparatus of claim 1, wherein said apparatus is configured for performing steps comprising detecting a weak very low frequency (VLF) magnetic field based on spin precession modulation (SPM) of electron resonance frequency or resonant precession modulation (RPM).

7. The apparatus of claim 3, wherein said apparatus is configured for performing steps comprising detecting a weak very low frequency (VLF) magnetic field based on spin precession modulation (SPM) of electron resonance frequency or resonant precession modulation (RPM).

* * * * *